(12) United States Patent
Esch, Jr.

(10) Patent No.: US 7,982,516 B1
(45) Date of Patent: Jul. 19, 2011

(54) RC-BASED DELAY ELEMENT AND METHOD FOR REDUCING FREQUENCY INDUCED DELAY VARIATION

(75) Inventor: Gerald Lee Esch, Jr., Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/727,363

(22) Filed: Mar. 19, 2010

(51) Int. Cl.
*H03H 11/26* (2006.01)
(52) U.S. Cl. ......... 327/277; 327/283; 327/284; 327/290
(58) Field of Classification Search .................. 327/277, 327/278, 281, 283–285, 288, 290
See application file for complete search history.

(56) References Cited

U.S. PATENT DOCUMENTS

| 5,559,476 | A * | 9/1996 | Zhang et al. ............... 331/57 |
| 6,255,879 | B1 | 7/2001 | Voss |
| 7,263,117 | B2 | 8/2007 | Lee et al. |
| 2009/0309642 | A1 | 12/2009 | Kim |

OTHER PUBLICATIONS

Kim, Gyudong; A Low-Voltage, Low-Power CMOS Delay Element, I.E.E.E. Journal of Solid-State Circuits, vol. 31, No. 7, Jul. 1996, pp. 966-971.

* cited by examiner

*Primary Examiner* — Lincoln Donovan
*Assistant Examiner* — William Hernandez

(57) ABSTRACT

A programmable delay element with a variable delay generator employs feed forward and feedback control signals to corresponding feed forward and feedback control elements integrated within the variable delay generator. The variable delay generator is responsive to a control signal. The variable delay generator uses transfer switches to couple reactive circuit elements to a signal node in accordance with the control signal. The feed forward element couples a fixed voltage to corresponding nodes of the feed back element. The feedback element completes a bypass circuit to apply the fixed voltage to the signal node once the programmable delay element has delayed a source signal. The feed forward element is responsive to a buffered version of the source signal. The feedback element is responsive to a buffered version of the output of the delay element. A corresponding method for reducing frequency induced delay variation in a programmable delay element is disclosed.

20 Claims, 7 Drawing Sheets

RC-BASED DELAY ELEMENT AND METHOD FOR REDUCING FREQUENCY INDUCED DELAY VARIATION

BACKGROUND

Digital circuits, such as those used in microprocessor units (MPUs), digital signal processors (DSPs), dynamic random access memory (DRAMs), programmable memory (e.g., EPROMs, EEPROMs, and flash), and application specific integrated circuits (ASICs), are characterized by signal propagation durations which become shorter with each decrease in switching element size and with corresponding increases in switching element integration density. These shorter signal propagation times can be exploited by reducing a clock cycle's period (i.e., increasing clock signal frequency) to perform logical functions more rapidly.

However, signal propagation time in integrated digital circuits is finite and non-uniform due to the parasitic capacitance, inductance, and resistance of interconnections and process variation of circuit elements. The non-uniformity of signal propagation has increased with integration density and circuit complexity such that signal propagation times cannot be reliably predicted.

Consider, for example, a circuit in which related signals are propagated in parallel such as respective bits of a binary code. If a logical combination of the bits is to be reliably performed, it is imperative that the bits be present and determinable of the intended logic state when the logical combination is to be performed. Traditional approaches include waiting until all signals are unconditionally settled at their desired logic state or inserting latches to store logic states at appropriate locations in the propagation path. Either solution undesirably reduces the operational speed of the logic function. Accordingly, it has become common practice to insert adjustable delay elements in select signal paths in order to synchronize the arrival of related signals at a desired location within a circuit.

In general, it is also common practice to generate delays in digital signals by propagating signals through a chain of serially connected inverter circuits. While some variation in propagation time is inevitable, the propagation time through a pair of inverters is a sufficiently small time increment to approximate a required delay. However, since propagation time may vary between stages and collectively over multiple stages (e.g. due to temperature, supply voltage, manufacturing process variations and other operational and environment conditions), it is desirable to provide the ability to program (i.e., adjust) a delay element to reduce the design burden of designing particular delay elements to achieve specified signal delay times. Thus, adjustable delay elements are used in integrated circuits as a viable mechanism for adjusting signal timing.

FIG. 1 schematically shows a typical prior art circuit 100 including an adjustable delay element 120. The adjustable delay element 120 receives a signal to be delayed along connection 115, labeled "IN," and generates a delayed representation of the received signal on connection 125, labeled "OUT." The adjustable delay element 120 includes a network of circuit elements 125 characterized by a total resistance, $R_{tot}$, between an input and an output of the adjustable delay element 125 and a total capacitance, $C_{tot}$, coupled in parallel with the output. The adjustable delay element 120 operates in accordance with a control bus 102, labeled "PVT[n,0]," that is tasked to controllably increase or decrease one or both of $R_{tot}$ and $C_{tot}$. The network of circuit elements 125 generates a time constant, $\tau$, equal to the product of the total resistance along and the total capacitance parallel to the internal connection. The time constant is increased by controllably increasing one or both of the resistance ($R_{tot}$) and the capacitance ($C_{tot}$) in the network of circuit elements 125.

FIG. 2 includes a graphical representation of output signal voltage (i.e., a signal on connection 125 of the prior art circuit 100 of FIG. 1. FIG. 2 represents time in picoseconds along the horizontal axis and normalized electrical potential in volts along the vertical axis. As shown in FIG. 2, a digitally programmable prior art circuit 100 responsive to a three bit control word can adjust the time it takes the normalized voltage to achieve a corresponding percentage of a steady-state voltage. For example, trace 201 is a time-varying voltage that achieves 90% of its normalized steady-state voltage in approximately 23 picoseconds (ps). As shown in the key to the right of the graph, the trace 201 includes points depicted with a plus sign (+). The control point that resulted in the trace 201 is characterized by a control word of 000. In contrast, trace 202 achieves 90% of its normalized steady-state voltage in approximately 45 ps. The trace 202 includes points depicted with an x. The control point responsible for the trace 202 is characterized by a control word of 001. Time-varying signal traces 203 through 208 include points depicted with respective unique symbols. Each of the signal traces 203 through 208 is characterized by a respective control word that directs the prior art circuit 100 to apply an increasing resistance or capacitance. Accordingly, each of the signal traces 203 through 208 achieves 90% of its normalized steady-state voltage in respective longer times with trace 205 through 208 unable to achieve the 90% level within 100 ps.

An inherent requirement of all reactive networks, including RC network based delay elements, is that the signal node needs to fully charge and discharge for predictable and repeatable signal behavior. Generally, it takes one time constant or $1\tau$, where $\tau = R \times C$, for an RC network to achieve about 63% of its steady-state voltage and about $5\tau$ for the RC network to achieve its steady-state voltage. Consequently, a prior art circuit 100 that uses an RC network based delay element will only properly function when the desired delay is a small fraction of the period of the desired switching rate. As shown in FIG. 2, increasing the delay (i.e., increasing the time constant of the RC network) causes the output voltage to not fully charge within the given time of 100 ps. As a result, subsequent signal transitions occur before the RC network is capable of achieving a steady-state voltage. Consequently, prior art delay elements based on a reactive network develop a frequency induced delay variation for clock periods or data transactions that are shorter than approximately $5\tau$. This frequency dependency causes logical signal switching times to be dependent on operating frequency.

SUMMARY

An embodiment of a programmable delay element comprises a feed forward generator, a signal path, and a feedback generator. The signal path has an input that receives a source signal and an output that provides a delayed representation of the source signal. The feed forward generator receives the source signal and generates a first control signal responsive to the source signal. The signal path further includes a variable delay generator that receives a modified source signal, a second control signal, a third control signal and the first control signal. The variable delay generator comprises reactive circuit elements, a feed forward element, and a feedback element. The passive circuit elements are coupled to a signal node in response to the second control signal. The feed forward element is responsive to the first control signal. The feedback element is responsive to the third control signal. The feedback generator is coupled to the output of the programmable delay element and is arranged to generate the third control signal in response to the delayed representation of the source signal.

An embodiment of a method for reducing frequency induced delay variation in a programmable delay element includes the steps of generating a feed forward control signal as a function of a source signal, applying the feed forward control signal to a set of feed forward control elements integrated within a variable delay generator, the set of feed forward control elements applying a fixed voltage level to a respective intermediate node that couples the set of feed forward control elements to a corresponding set of feedback control elements, and applying the feedback control signal to the set of feedback control elements integrated within the variable delay generator, the set of feedback control elements completing respective bypass circuits to effectively remove a corresponding reactive circuit element from a signal node in the variable delay generator.

The figures and detailed description that follow are not exhaustive. The disclosed embodiments are illustrated and described to enable one of ordinary skill to make and use the delay element and method for reducing frequency induced delay variation in a delay element. Other embodiments, features and advantages will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The programmable delay elements and methods for reducing frequency induced delay variation in a programmable delay element can be better understood with reference to the following figures. The components within the figures are not necessarily to scale, emphasis instead being placed upon clearly illustrating the principles of applying feed forward control and feedback control to modify the configuration of a delay element including a network of reactive circuit elements to adjust a time constant affected signal response after a delay element has delayed an input signal. The programmable delay element enables full scale (i.e., rail-to-rail or supply voltage to electrical ground) signal voltage transitions with longer delays. Moreover, in the figures, like reference numerals designate corresponding parts throughout the different views.

DETAILED DESCRIPTION

Figure 1:
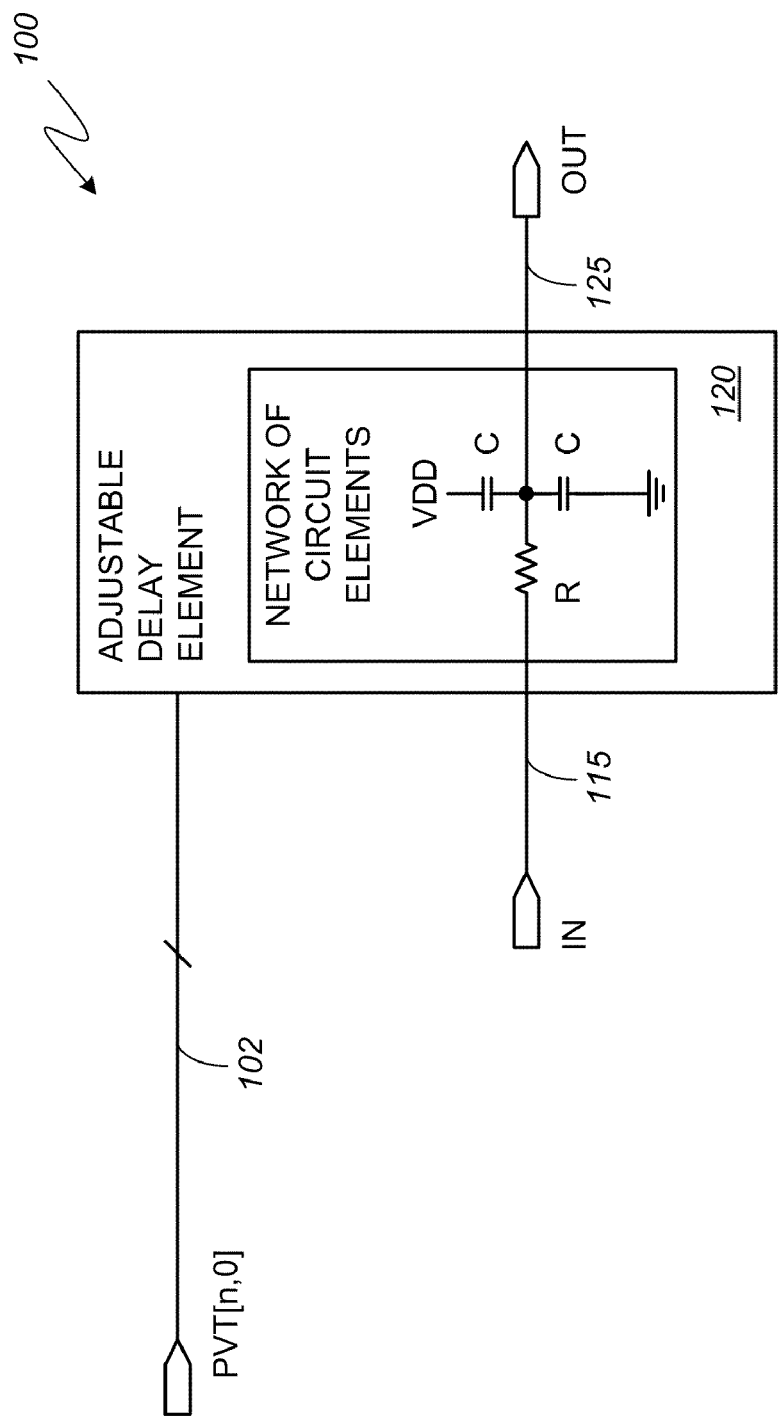
FIG. 1 is a schematic representation of a conventional circuit for delaying an input signal.

An example embodiment of a programmable delay element includes a variable delay generator that applies feed forward and feedback control signals to corresponding feed forward and feedback control elements integrated within the variable delay generator. The variable delay generator is responsive to a control signal. In the illustrated embodiment, the control signal is a digital word. In alternative embodiments, the programmable delay element is controlled using one or more analog control signals to increase the time constant of the variable delay generator.

In an embodiment, the variable delay generator uses transfer switches to couple reactive circuit elements to a signal node as directed by the control signal. The feed forward element couples a fixed voltage to corresponding nodes of the feed back element. A first branch of the feed forward element is coupled to a supply voltage. A second branch of the feed forward element is coupled to electrical ground. The feedback element completes a bypass circuit to apply the fixed voltage to the signal node once the programmable delay element has delayed a source signal. A first branch of the feedback element is coupled to the first branch of the feed forward element. A second branch of the feedback element is coupled to a second branch of the feed forward element. The feed forward element is responsive to a buffered version of the source signal. The feedback element is responsive to a buffered version of the output of the delay element. When applied after the delay element has delayed the source signal, the feed forward and feedback control rapidly prepares variable delay generator for the next signal transition by quickly returning the signal node to the supply voltage or signal ground. The programmable delay element enables full scale (i.e., rail-to-rail or supply voltage to electrical ground) signal voltage transitions in less time despite longer delays in a reactive network.

Another example embodiment includes a method for reducing frequency induced delay variation in a programmable delay element. The method includes the steps of generating a feed forward control signal as a function of a source signal, applying the feed forward control signal to a set of feed forward control elements within a variable delay generator, the set of feed forward control elements applying a fixed voltage level to a respective intermediate node that couples the set of feed forward control elements to a corresponding set of feedback control elements, generating a feedback control signal as a function of a delayed source signal, and applying the feedback control signal to the set of feedback control elements integrated within the variable delay generator, the set of feedback control elements completing respective bypass circuits to effectively remove a corresponding reactive circuit element from a signal node in the variable delay generator. The method for reducing frequency induced delay variation in a programmable delay element accomplishes the desired goal by enabling full scale (i.e., rail-to-rail or supply voltage to electrical ground) signal voltage transitions in less time than conventional designs that use a reactive network.

Figure 3:
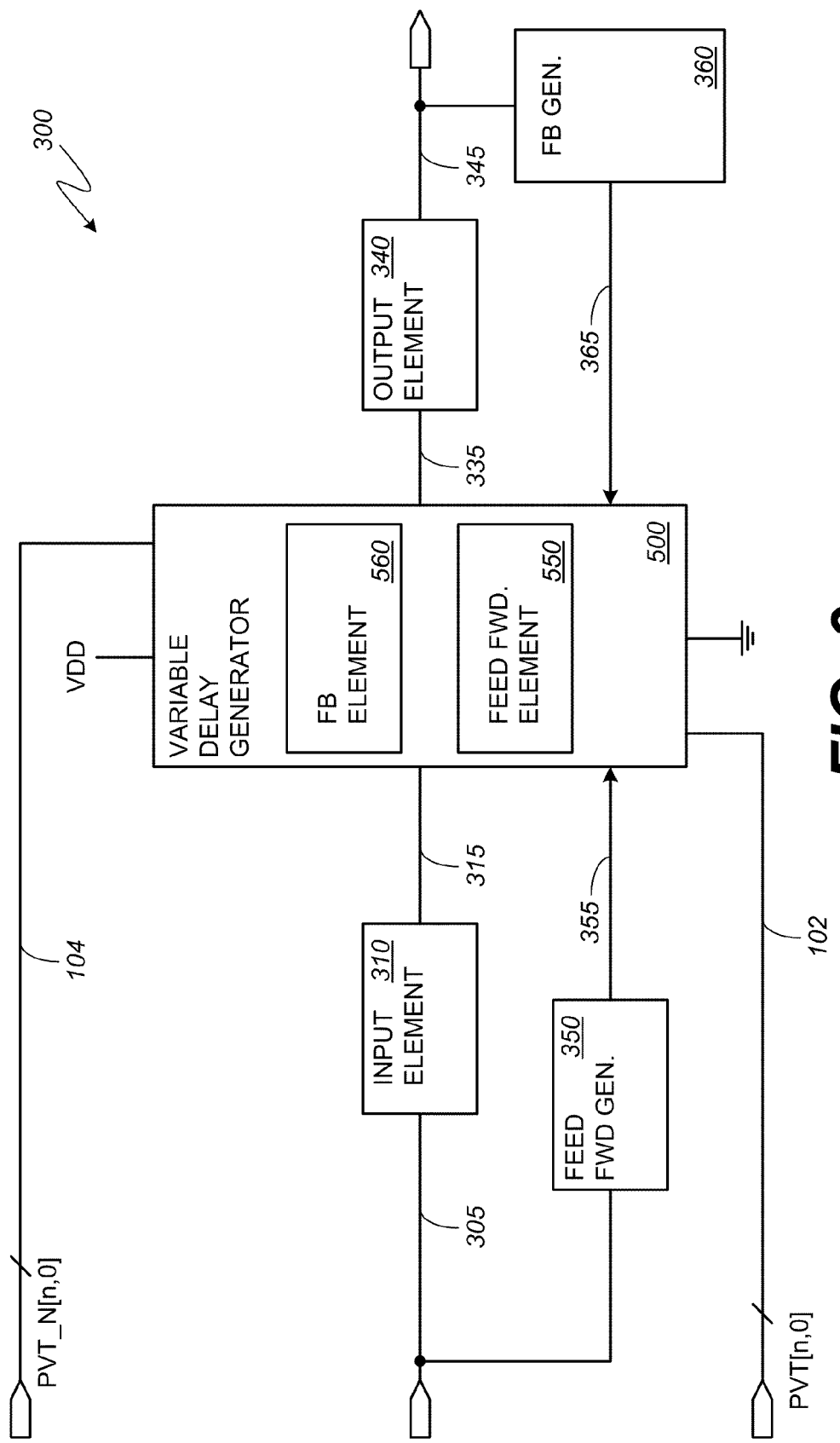
FIG. 3 is a schematic diagram illustrating an embodiment of a programmable delay element that employs feedback control and feed-forward control.

Turning now to the drawings, wherein like reference numerals designate corresponding parts throughout the drawings, reference is made to FIG. 3, which includes a schematic diagram illustrating an embodiment of a programmable delay element that employs feedback control and feed-forward control. The programmable delay element 300 includes a signal path having an input and an output. The signal path includes a serial arrangement of an input element 310, a variable delay generator 500, and an output element 340. The signal path of the programmable delay element 300 receives a source signal or a signal to be delayed on connection 305 and provides a delayed representation of a modified source signal on connection 345 which coincides with the output of the signal path.

As indicated in FIG. 3, the source signal on connection 305 is processed by input element 310, which generates and forwards an electrically isolated version of the source signal to the variable delay generator 500 on connection 315. The variable delay generator 500 includes a network of reactive circuit elements (not shown) that are controllably coupled to a signal node (not shown) in accordance with a true control word (labeled PVT[n,0]) received on bus 102 and a complimentary control word (labeled PVT_N[n,0]) received on bus 104. The variable delay generator 500 can be arranged in a single-ended or a differential circuit configuration as may be desired. The true and complimentary control words may comprise binary weighted, thermometer coded or grey coded digital words. Furthermore, each bit or bus conductor within the bus 102 and the bus 104 may be coupled to respective transfer elements that couple or decouple a desired reactive circuit element having a corresponding reactance to the signal node. The variable delay generator 500 increases the duration, that is, further delays a signal on connection 315 by controllably coupling additional reactance to the signal node which is coupled to connection 335. The delayed version of the source signal forwarded by the variable delay generator 500 on connection 335 is further processed by output element 340, which forwards an electrically isolated version of the modified source signal on connection 345 at the output of the signal path.

As further illustrated in FIG. 3, a feed forward generator 350 receives the source signal on connection 305 and in response to the source signal generates a feed forward control signal, which is forwarded to the feed forward element 550 in the variable delay generator 500 on connection 355. In addition to the feed forward generator 350, the programmable delay element 300 further includes a feedback generator 360 that receives the output signal on connection 345 and in response to the delayed representation of the modified source signal generates a feedback control signal, which is coupled to the feedback element 560 in the variable delay generator 500. As will be described in greater detail in association with embodiments illustrated in FIG. 5 and FIG. 6, the feed forward element 550 and the feedback element 560 reconfigure the variable delay generator at appropriate times in accordance with the feed forward control signal on connection 355 and the feedback control signal on connection 365 to enable a network of reactive circuit elements to more quickly return to a rail voltage level. Consequently, the programmable delay element 300 avoids or reduces frequency induced delay variation, which is inherent in delay elements based on prior art RC networks that are deployed in circuits with decreasing switching periods or longer delays.

Figure 4:
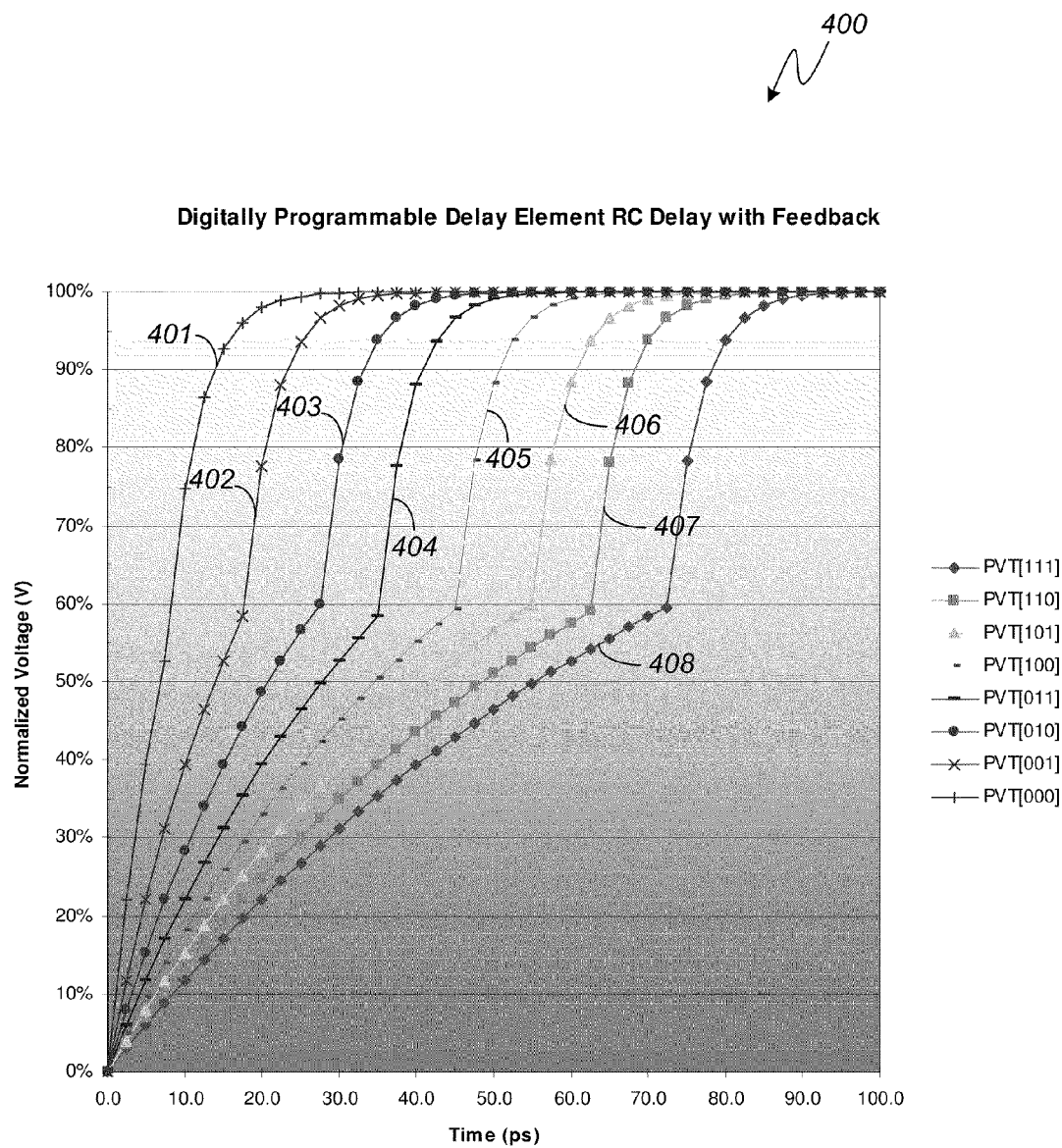
FIG. 4 is a graph illustrating signal voltage over time for various control points applied to the programmable delay element of FIG. 3.

FIG. 4 is a graph illustrating signal voltage over time for various control points applied to the programmable delay element 300 of FIG. 3. FIG. 4 includes a graphical representation of output signal voltage (i.e., a signal on connection 345) of the programmable delay element 300 of FIG. 3. FIG. 4 represents time in picoseconds along the horizontal axis and normalized electrical potential in volts along the vertical axis. As shown in FIG. 4, a digitally programmable delay element, such as the programmable delay element 300, which is responsive to a three-bit control word, a feed forward control signal and a feedback control signal, dramatically reduces the time it takes the normalized voltage to achieve a desired percentage of a steady-state voltage. Note that the change in each of the traces illustrated in FIG. 4 when compared to the corresponding signal trace from the graph in FIG. 2 occurs after the programmable delay element 300 has achieved about 60% of its normalized steady-state voltage. For a delay element that transitions when signal voltage is about VDD/2 (or at about a normalized voltage of 50% of a steady-state voltage) the change in the signal trace clearly occurs after the programmable delay element has delayed the source signal. Stated another way, the programmable delay element 300 provides the same range of delay as conventional delay elements that adjust an RC time constant absent the frequency induced delay variation introduced by premature switching events that occur in applications with a reduced clock period. A premature switching event is any signal transition that occurs before the delay element is fully charged or fully discharged.

Figure 2:
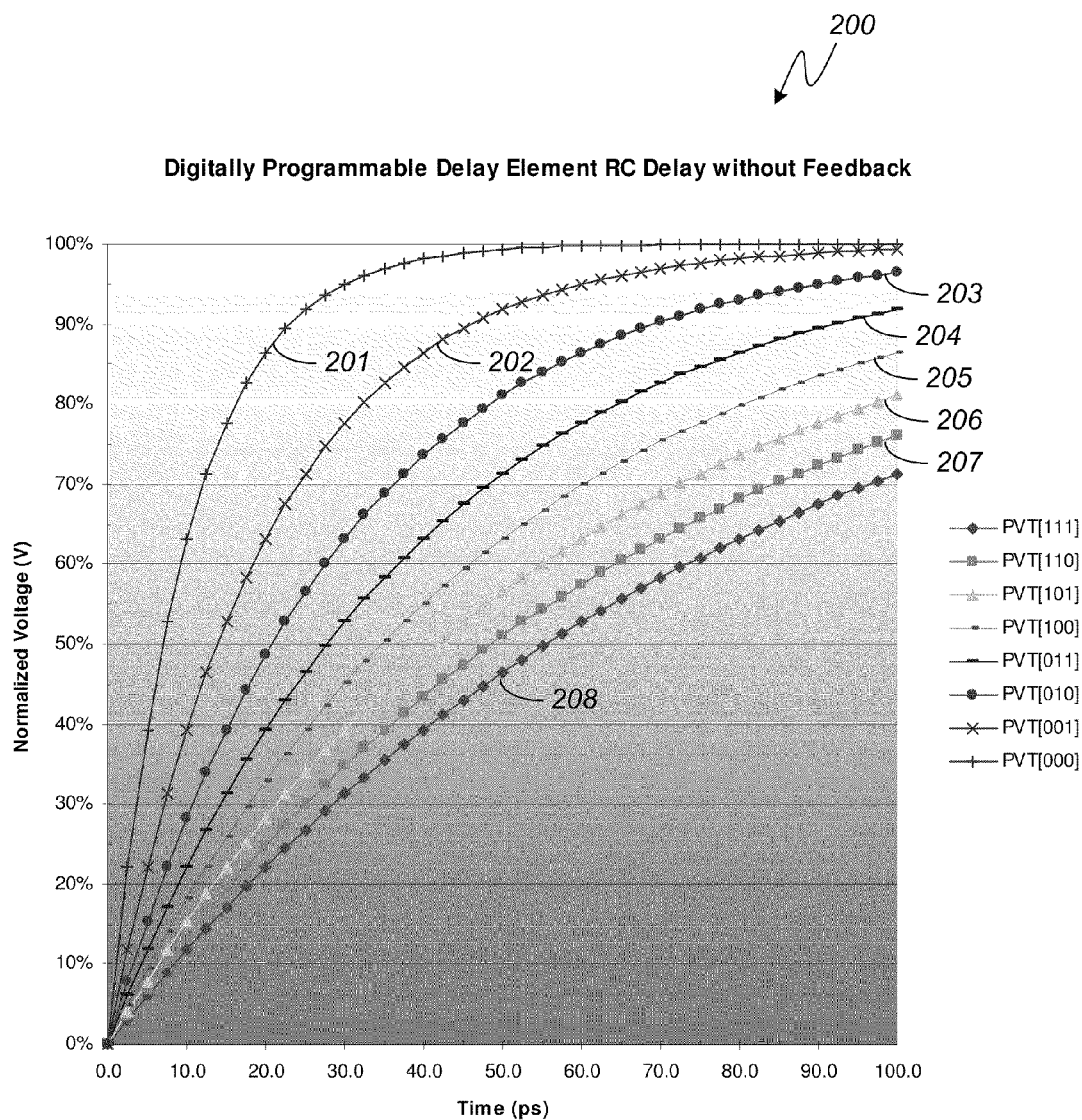
FIG. 2 is a graph illustrating signal voltage over time for various control points applied to the conventional circuit of FIG. 1.

For example, trace 401 is a time-varying voltage that achieves 90% of its normalized steady-state voltage in about 15 ps and reaches its steady-state voltage in just over 25 ps. In comparison, trace 201, corresponding to the same 000 control word, achieves 90% of its normalized steady-state voltage in approximately 23 ps and reaches its steady-state voltage in about 59 ps in the absence of the feed forward and feedback control. By way of further example, trace 402 achieves 90% of its normalized steady-state voltage in about 23 ps and reaches its steady-state voltage in about 37 ps. In comparison, trace 202, corresponding to the same 001 control word, achieves 90% of its normalized steady-state voltage in approximately 45 ps and fails to reach its steady-state voltage before 100 ps. As shown in FIG. 2, each trace (e.g., traces 203-208) associated with ever increasing time constants fails to achieve the steady-state voltage in 100 ps. In contrast, the programmable delay element 300, as illustrated in FIG. 4, shifts each of the traces 401 through 408 such that each achieves the steady-state voltage in under 100 ps. Accordingly, the programmable delay element 300 clearly reduces the time it takes for the output signal to achieve a steady-state voltage level.

Figure 5:
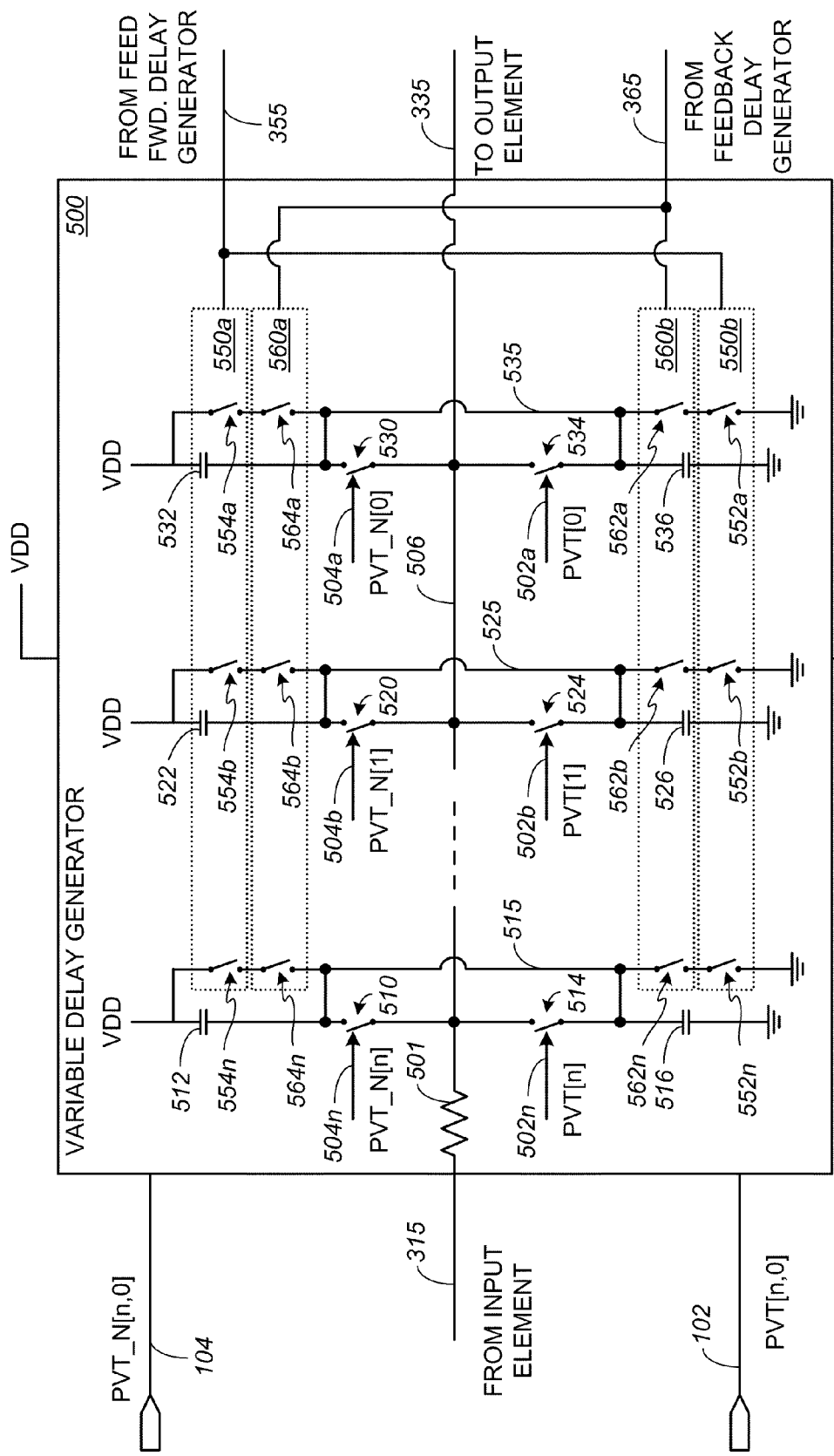
FIG. 5 is a schematic diagram illustrating an embodiment of the variable delay generator of FIG. 3.

FIG. 5 is a schematic diagram illustrating an embodiment of the variable delay generator 500 of FIG. 3. The variable delay generator 500 operates in accordance with a supply voltage VDD, which is offset from electrical ground. The supply voltage and electrical ground provide a signal voltage maximum level and a signal voltage minimum level or rail-to-rail voltages. The variable delay generator 500 receives an electrically isolated version of the source signal on connection 315, which is forwarded to signal node 506 by way of the resistor 501. As will be explained in greater detail, the variable delay generator 500 controllably further delays the source signal before communicating the same to the output element 340 (not shown) on output connection 335.

In the illustrated embodiment, the variable delay generator 500 is a network of capacitive circuit elements that are controllably coupled to the signal node 506 in accordance with the true control word (labeled PVT[n,0]) received on bus 102 and the complimentary control word (labeled PVT_N[n,0]) received on bus 104. The network of capacitive circuit elements includes capacitor 512, capacitor 522, capacitor 532, capacitor 516, capacitor 526, and capacitor 536 with capacitors 512, 522 and 532 arranged between the supply voltage VDD and the signal node 506 and the capacitors 516, 526 and 536 arranged between the signal node 506 and ground.

Each of the capacitors in the network of capacitive elements is controllably coupled and or removed from the signal node 506 by way of a respective transfer element or switch which is closed or opened in accordance with a select bit of the true and complimentary versions of the control word. For example, transfer element 510, coupled between capacitor 512 and the signal node 506, operates in accordance with the most significant bit of the complimentary control word provided to the transfer element 510 on connection 504n. Transfer element 520, coupled between capacitor 522 and the signal node 506, operates in accordance with the second to least significant bit of the complimentary control word provided on connection 504b. Similarly, transfer element 530, coupled between capacitor 532 and the signal node 506, operates in accordance with the least significant bit of the complimentary control word provided on connection 504a.

By way of further example, transfer element 514, coupled between capacitor 516 and the signal node 506, operates in accordance with the most significant bit of the true control word provided to the transfer element 514 on connection 502n. Transfer element 524, coupled between capacitor 526 and the signal node 506, operates in accordance with the second to least significant bit of the true control word provided on connection 502b. Similarly, transfer element 534, coupled between capacitor 536 and the signal node 506, operates in accordance with the least significant bit of the true control word provided on connection 502a.

The capacitor 532 and the capacitor 536 have about an equal capacitance and increase the time constant of the variable delay generator 500 in an amount that corresponds to the smallest duration of additional and controllable delay that is desired to be applied by the variable delay generator 500. The capacitor 522 and the capacitor 526 have about an equal capacitance which is twice as large as the capacitance of the capacitor 532 and the capacitor 536. Similarly, the capacitor 512 and the capacitor 516 have about an equal capacitance that corresponds to a binary weighted value associated with the magnitude of the nth bit. That is, for a 4-bit control word, the capacitance of the capacitor 512 and the capacitor 516 is about eight times as large as the capacitance of the capacitor 532 and the capacitor 536.

In addition to the network of capacitive elements, the variable delay generator 500 further includes a feed forward control element 550 and a feedback control element 560. The feed forward control element 550 has a first branch 550a and a second branch 550b. The first branch 550a includes respective switches 554n, 554b and 554a coupled to the supply voltage and associated with each of capacitor 512, capacitor 522 and capacitor 532. The second branch 550 b includes respective switches 552n, 552b and 552a coupled to ground and associated with each of capacitor 516, capacitor 526 and capacitor 536. The feed forward control element 550 operates, that is, switches 554n, 564n, 554b, 564b, 554a and 564a are opened or closed in accordance with a control signal received from the feed forward delay generator 350 on connection 355.

Similarly, the feedback control element 560 has a first branch 560a and a second branch 560b. The first branch 560a includes respective switches 564n, 564b and 564a coupled to respective switches of the first branch 550a of the feed forward control element 550 via a corresponding intermediate node. When switches 554n and 564n are both closed, the capacitor 512 is bypassed and the supply voltage is coupled to the signal node 506. When switches 554b and 564b are both closed, the capacitor 522 is bypassed and the supply voltage is coupled to the signal node 506. When switches 554a and 564a are both closed, the capacitor 532 is bypassed and the supply voltage is coupled to the signal node 506. The second branch 560b of the feedback control element 560 includes respective switches 562n, 562b and 562a coupled by a corresponding intermediate node to respective switches of the second branch 550b of the feed forward control element 550. When switches 552n and 562n are both closed, the capacitor 516 is bypassed and the signal node 506 is coupled to ground. When switches 552b and 562b are both closed, the capacitor 526 is bypassed and the signal node 506 is coupled to ground. When switches 552a and 562a are both closed, the capacitor 536 is bypassed and the signal node 506 is coupled to ground. The feedback control element 560 operates, that is, switches 562n, 564n, 562b, 564b, 562a and 564a are opened or closed in accordance with a control signal received from the feedback delay generator 360 on connection 365.

In operation, the feed forward control signal as coupled to the respective control inputs of the switches 552n, 554n, 552b, 554b, 552a, 554a, begins but does not complete the configuration of a respective bypass circuit or shunt that will apply a fixed voltage level to the signal node 506. As will be explained in greater detail with the description of the embodiment illustrated in FIG. 6, the feedback control signal, which arrives after the output element 340 has transitioned from a first logic level to a second logic level (e.g., from ground to VDD or from VDD to ground) is applied at the respective control inputs of the switches 562n, 564n, 562b, 564b, 562a and 564a. Application of the feedback control signal closes the switches 562n, 564n, 562b, 564b, 562a and 564a thus completing the bypass circuit or shunt that forces the RC network to more quickly charge or discharge the signal node 506.

In addition, when a shunt or bypass circuit is completed to ground, the connection 515 discharges the capacitor 512, the connection 525 discharges the capacitor 522 and the connection 535 discharges the capacitor 532. When a shunt or bypass circuit is completed to VDD, the connection 515 charges the capacitor 516, the connection 525 charges the capacitor 526 and the connection 535 charges the capacitor 536.

Figure 6:
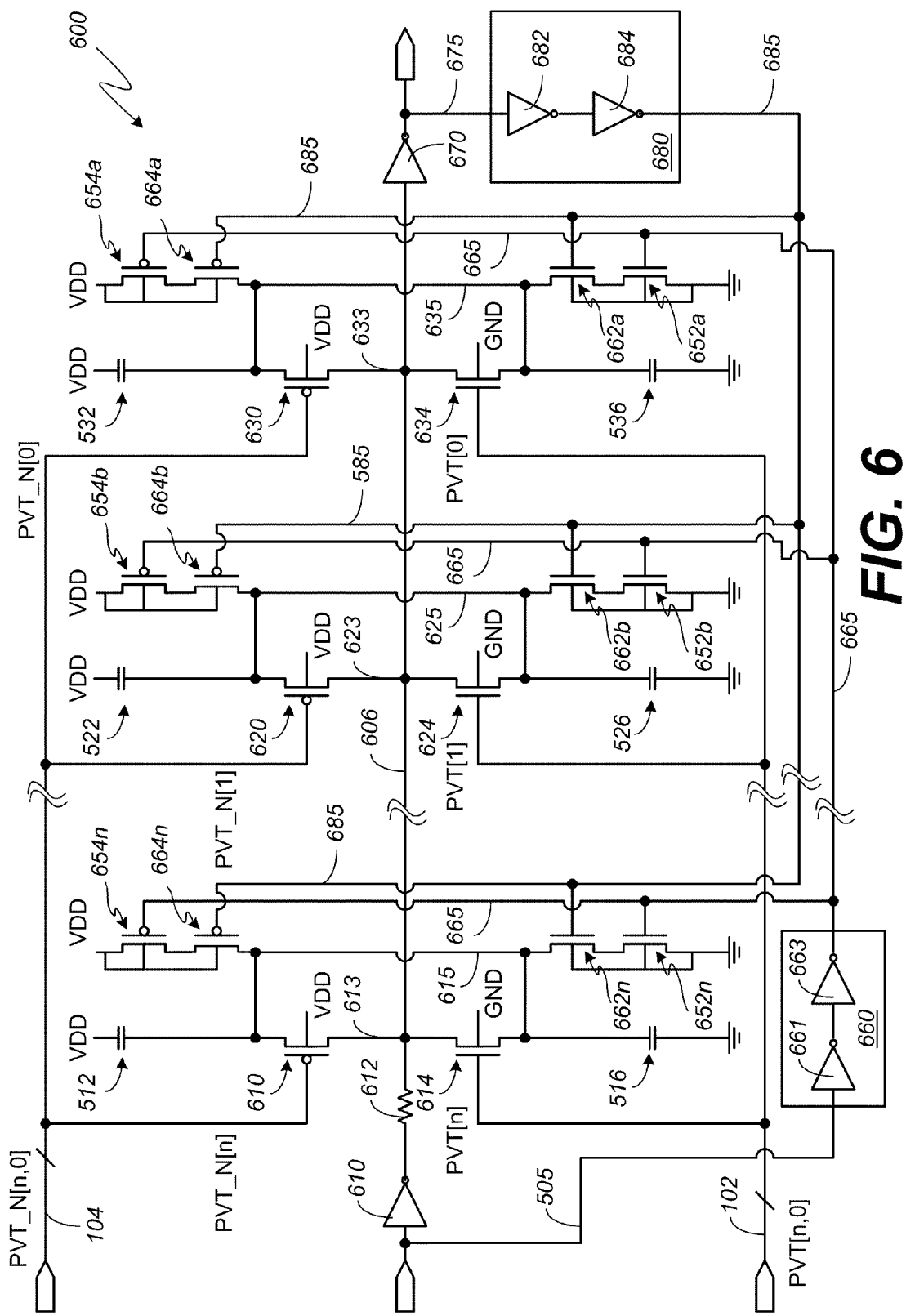
FIG. 6 is a schematic diagram illustrating an alternative embodiment of the programmable delay element of FIG. 3.

FIG. 6 is a schematic diagram illustrating an alternative embodiment of the programmable delay element 300 of FIG. 3. The programmable delay element 600 includes a signal path having an input on connection 505 and an output on connection 675. The signal path includes a serial arrangement of an inverter 610, a resistor 612, an internal signal node 606 and the inverter 670. The signal path of the programmable delay element 600 receives a source signal or a signal to be delayed on connection 505 and provides a delayed representation of a modified source signal on connection 675 which coincides with the output of the signal path.

As indicated in FIG. 6, the source signal on connection 505 is processed by the inverter 610 which delays and shifts the phase of the source signal. The delayed and phase-shifted version of the source signal is forwarded to the internal signal node 606 by way of the resistor 612. The resistor 612 can be a polysilicon resistor or a discrete resistor having a fixed resistance. The programmable delay element 600 includes a network of reactive circuit elements embodied in the capacitors 512, 516, 522, 526, 532 and 536 arranged about the signal node 606. The capacitors 512, 516, 522, 526, 532 and 536 are controllably coupled to the signal node 606 in accordance with a true control word (labeled PVT[n,0]) received on bus 102 and the complimentary control word (labeled PVT_N[n, 0]) received on bus 104. Each of the capacitors 512, 522 and 532 can be implemented with a PFET arranged as a p-type capacitance to VDD, a discrete capacitor, or a metal oxide metal capacitor. Similarly, each of the capacitors 516, 526 and 536 can be implemented with a NFET arranged as a n-type capacitance to ground, a discrete capacitor, or a metal oxide metal capacitor. As described above, the programmable delay element 600 can be arranged in a single-ended or a differential circuit configuration as may be desired. In addition, the true and complimentary control words may comprise a binary weighted, thermometer coded or grey coded digital words.

However configured, the bus signals are applied to an appropriately sized capacitance to provide an expected change in the time constant as each pair of capacitances is controllably added or removed from the signal node 606.

As indicated in FIG. 6, each bit or bus conductor within the bus 102 and the bus 104 is coupled to a respective transfer element that couples or decouples a respective capacitor to the signal node 606. In the illustrated embodiment, the transfer elements 610, 620 and 630 are PFETs and the transfer elements 614, 624 and 634 are NFETs. The programmable delay element 600 increases the duration, that is, further delays a source or input signal by controllably coupling additional capacitance to the signal node 606. The delayed version of the source signal forwarded by the programmable delay element 600 is further processed by the inverter 670, which forwards a delayed and phase-corrected representation of the modified (i.e., delayed) source signal on connection 675 at the output of the signal path.

As further illustrated in FIG. 6, a feed forward generator 660 receives the source signal on connection 505 and in response to the source signal generates a feed forward control signal, which is forwarded to a set of switches that perform feed forward control in the programmable delay element 600. In the illustrated embodiment, the feed forward generator 660 comprises a serial combination of a first inverter 661 and a second inverter 663. The feed forward control signal is provided on connection 665, which is coupled to the NFET 652n, NFET 652b and NFET 652a, which are arranged and configured to apply a ground voltage level to a respective intermediate node that couples each switch or NFET to a corresponding switch in a feedback element (not shown). The feed forward control signal is further coupled to the PFET 654n, PFET654b and PFET 654a, which are arranged and configured to apply VDD to a respective intermediate node that couples each switch or PFET to a corresponding switch in the programmable delay element 600. Feed forward control in the programmable delay element 600 is performed by opening or closing PFET 654n, PFET654b, PFET 654a, NFET 652n, NFET 652b and NFET 652a in accordance with the feed forward control signal received from the feed forward delay generator 660 on connection 665.

In addition to the feed forward generator 660, the programmable delay element 600 further includes a feedback generator 680 that receives the output signal on connection 675. In response to the delayed representation of the modified source signal, the feedback generator 680 generates a feedback control signal, which is coupled to the switches providing feedback control in the programmable delay element 600. In the illustrated embodiment, the feedback generator 680 comprises a serial combination of a third inverter 682 and a fourth inverter 684.

The set of switches performing the feedback control function in the programmable delay element 600 includes NFET 662n, NFET 662b and NFET 662a, which are arranged and configured to complete a bypass path or circuit to effectively remove a corresponding capacitance from the signal node 606. The set of switches performing the feedback control function in the programmable delay element 600 further includes PFET 664n, PFET 664b and PFET 664a, which are arranged and configured to complete a bypass path or circuit to effectively remove a corresponding capacitance from the signal node 606. Feedback control in the programmable delay element 600 is performed by opening or closing PFET 664n, PFET 664b, PFET 664a, NFET 662n, NFET 662b and NFET 662a in accordance with the feedback control signal received from the feedback delay generator 680 on connection 685.

When PFET 654n and PFET 664n are both closed, the capacitor 512 is bypassed and the supply voltage is coupled to the signal node 606 by the connection 613. When PFET 654b and PFET 664b are both closed, the capacitor 522 is bypassed and the supply voltage is coupled to the signal node 606 by the connection 623. When PFET 654a and PFET 664a are both closed, the capacitor 532 is bypassed and the supply voltage is coupled to the signal node 606 by the connection 633. When NFET 652n and NFET 662n are both closed, the capacitor 516 is bypassed and the signal node 606 is coupled to ground. When NFET 652b and NFET 662b are both closed, the capacitor 526 is bypassed and the signal node 606 is coupled to ground. When NFET 652a and NFET 662a are both closed, the capacitor 536 is bypassed and the signal node 606 is coupled to ground.

Consider a source signal transition from a logic low voltage (e.g., ground) to a logic high voltage (e.g., VDD). In operation, the feed forward control signal, as coupled to the respective gates of NFET 652n, PFET 654n, NFET 652b, PFET 654b, NFET 652a, PFET 654a, places the PFET 654n, PFET 654b and PFET 654a in a cutoff or high-impedance mode of operation (i.e., the PFET is open or non-conducting) and places NFET 652n, NFET 652b and NFET 652a in a saturation mode (i.e., the NFET is closed or conducting). This preliminary step allows the RC network to discharge the signal node 606 from VDD to a logic low state or ground. After approximately 1τ the inverter 670 switches states from a logic low voltage to a logic high voltage because the signal node 606 has reached and crossed the inverter's trigger voltage. At that time the output signal on connection 675 is driven to a low logic voltage or ground and the feedback control signal will similarly transition after the relatively brief propagation delay that results from signal processing in the third inverter 682 and the fourth inverter 684. The feedback control signal as applied at the respective gates of NFET 662a, PFET 664a, NFET 662b, PFET 664b, NFET 662n and PFET 664n places the PFET 654n, PFET 654b and PFET 654a into cutoff mode (i.e., the PFET is open or non-conducting) and places the NFET 662n, NFET 662b and NFET 662a in saturation mode (i.e., the NFET is closed or conducting). Consequently, the signal node 606 is shunted to ground. Once the signal node 606 has reached ground, NFET 662n, NFET 662b and NFET 662a are in cutoff mode (i.e., the NFET is open or non-conducting) and the programmable delay element is prepared for the next signal transition.

Thereafter, a source signal transition from a logic high voltage (e.g., VDD) to a logic low voltage (e.g., ground) occurs as follows. The feed forward control signal, as coupled to the respective gates of NFET 652n, PFET 654n, NFET 652b, PFET 654b, NFET 652a, PFET 654a, places the PFET 654n, PFET 654b and PFET 654a in a saturation mode (i.e., the PFET is closed or conducting) and places NFET 652n, NFET 652b and NFET 652a in a cutoff or high-impedance mode of operation (i.e., the NFET is open or non-conducting). This preliminary step allows the RC network to charge the signal node 606 from ground to VDD. After approximately 1τ the inverter 670 switches states from a logic high voltage to a logic low voltage because the signal node 606 has reached and crossed the inverter's trigger voltage. At that time the output signal on connection 675 is driven to a high logic voltage or VDD and the feedback control signal will similarly transition after the relatively brief propagation delay that results from signal processing in the third inverter 682 and the fourth inverter 684. The feedback control signal as applied at the respective gates of NFET 662a, PFET 664a, NFET 662b, PFET 664b, NFET 662n and PFET 664n places the PFET 654n, PFET 654b and PFET 654a into saturation mode (i.e., the PFET is closed or conducting) and places the NFET 662*n*, NFET 662*b* and NFET 662*a* in cutoff mode (i.e., the NFET is open or non-conducting). Consequently, the signal node 606 is shunted to VDD. Once the signal node 606 has reached VDD, NFET 662*n*, NFET 662*b* and NFET 662*a* are in saturation mode (i.e., the NFET is closed or conducting) and the programmable delay element is prepared for the next signal transition.

As described above in association with the embodiment in FIG. 5, when a shunt or bypass circuit is completed to ground, the connection 615 discharges the capacitor 512, the connection 625 discharges the capacitor 522 and the connection 635 discharges the capacitor 532. When a shunt or bypass circuit is completed to VDD, the connection 615 charges the capacitor 516, the connection 625 charges the capacitor 526 and the connection 635 charges the capacitor 536.

Figure 7:
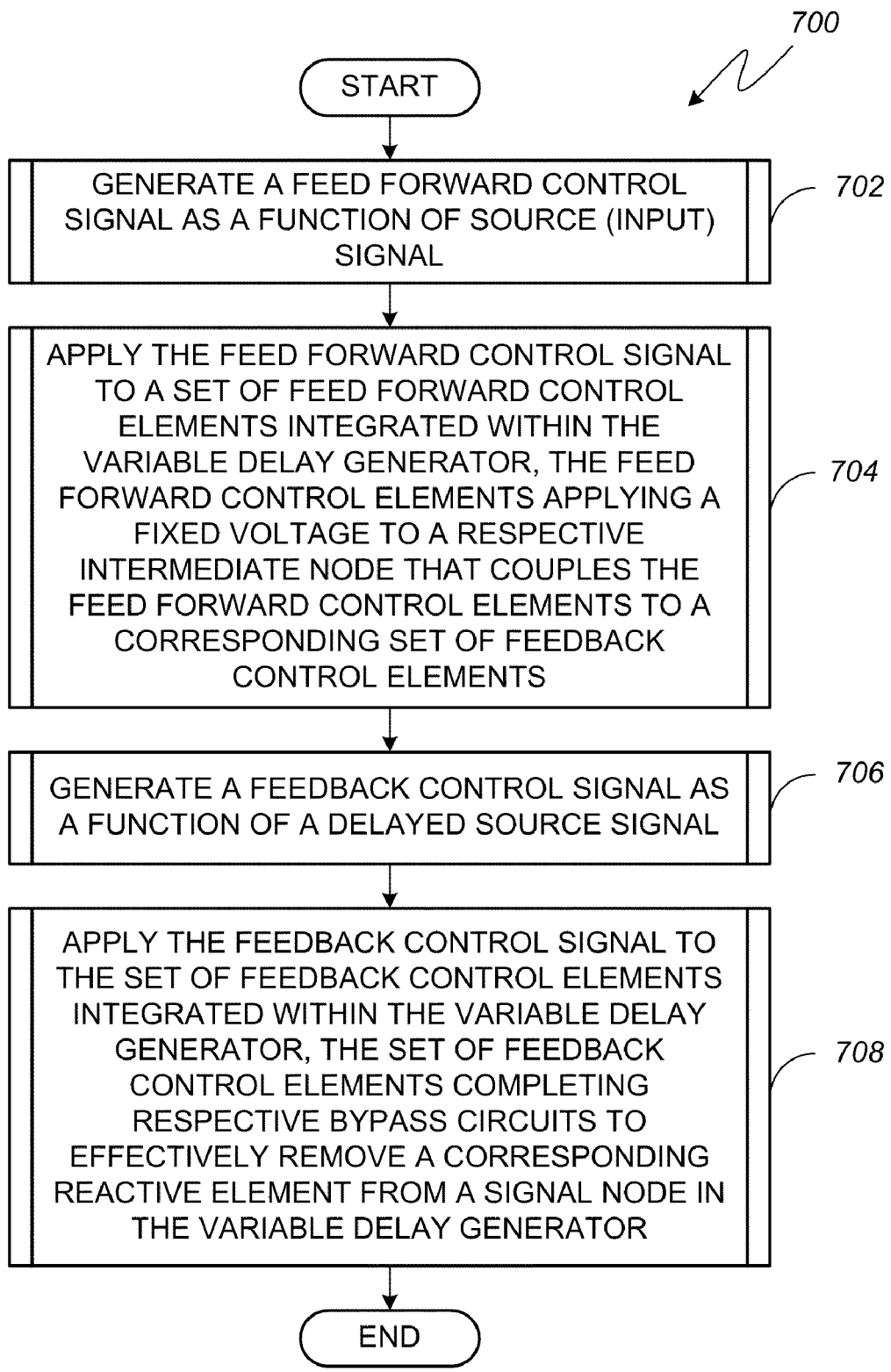
FIG. 7 is a flow chart illustrating an embodiment of a method for reducing frequency induced delay variation in a programmable delay element.

FIG. 7 is a flow chart illustrating an embodiment of a method 700 for reducing frequency induced delay variation in a programmable delay element, such as the programmable delay element 300. The method 700 begins with block 702, where a feed forward control signal is generated in a feed forward generator 350. The feed forward control signal is generated as a function of a source or input signal. Thereafter, as indicated in block 704, the feed forward control signal is applied to a set of feed forward control elements integrated within the variable delay generator 500. As further indicated in block 704, the feed forward control elements 550 apply a fixed voltage to a respective intermediate node that couples the feed forward control elements 550 to a corresponding set of feedback control elements 560.

The method 700 continues with block 706, where a feedback control signal is generated in a feedback generator 360. As indicated in block 706, the feedback control signal is generated as a function of the delayed source signal. Thereafter, as indicated in block 708, the feedback control signal is applied to a set of feedback control elements 560 within the variable delay generator 500. As further indicated in block 708, the feedback control elements complete respective bypass circuits to effectively remove a corresponding reactive element from a signal node in the variable delay generator 500.

While various example embodiments of the circuits and methods for reducing frequency induced delay variation in a programmable delay element have been described, it will be apparent to those skilled in the art that many more embodiments and implementations are possible that are within the scope of this disclosure. Accordingly, the described delay elements and methods are not to be restricted or otherwise limited except in light of the attached claims and their equivalents.

What is claimed is:

1. A programmable delay element, comprising:
 a feed forward generator arranged to receive a source signal and generate a first control signal responsive to the source signal;
 a signal path having an input and an output, the signal path including:
  a variable delay generator arranged to receive a modified source signal, the first control signal, a second control signal, and a third control signal, the variable delay generator comprising reactive circuit elements that are coupled to a signal node in response to the second control signal, a feed forward element responsive to the first control signal, and a feedback element responsive to the third control signal, the variable delay generator configured to generate a delayed representation of the modified source signal responsive to the second control signal; and
  a feedback generator coupled to the output and arranged to generate the third control signal responsive to the delayed representation of the modified source signal.

2. The delay element of claim 1, wherein the signal path further comprises a first inverter and a second inverter coupled in series with the source signal.

3. The delay element of claim 1, wherein the signal path further comprises a first delay element, a fixed circuit element, and a second delay element, the first delay element and the fixed circuit element coupled in series between the input and the signal node of the variable delay generator, the second delay element coupled between the variable delay generator and the feedback generator.

4. The delay element of claim 3, wherein the first delay element and the second delay element comprise respective inverters.

5. The delay element of claim 3, wherein the fixed circuit element has a resistance.

6. The delay element of claim 1, wherein the feed forward element comprises a first set of switches coupled in pairs.

7. The delay element of claim 6, wherein each member of the first set of switches is coupled to a fixed voltage level.

8. The delay element of claim 1, wherein the feed back element comprises a second set of switches coupled in pairs.

9. The delay element of claim 8, wherein each member of the second set of switches is coupled to a respective reactive circuit element and to a corresponding member of a first set of switches.

10. The delay element of claim 8, wherein each member of the second set of switches is coupled to a respective transfer switch and a respective capacitance.

11. The delay element of claim 1, wherein the variable delay generator increases a duration of the delayed representation of the modified source signal by controllably coupling the reactive circuit element to the signal node in the variable delay generator.

12. The delay element of claim 1, wherein the variable delay generator is arranged in a differential circuit configuration.

13. The delay element of claim 1, wherein the variable delay generator comprises native field-effect transistors arranged as capacitors.

14. The delay element of claim 1, wherein the second control signal comprises a binary weighted, thermometer coded or grey coded digital word with each bit of the word applied to a respective transfer switch that couples an appropriate capacitance to a signal node in the variable delay generator.

15. A method for reducing frequency induced delay variation in a programmable delay element, the method comprising:
 generating a feed forward control signal as a function of a source signal;
 applying the feed forward control signal to a set of feed forward control elements integrated within a variable delay generator, the set of feed forward control elements applying a fixed voltage level to a respective intermediate node that couples the set of feed forward control elements to a corresponding set of feedback control elements;
 generating a feedback control signal as a function of a delayed source signal; and
 applying the feedback control signal to the set of feedback control elements integrated within the variable delay generator, the set of feedback control elements completing respective bypass circuits to effectively remove a corresponding reactive circuit element from a signal node in the variable delay generator.

16. The method of claim 15, wherein generating a feed forward control signal as a function of a source signal comprises coupling a first inverter and a second inverter in series with each other and the source signal.

17. The method of claim 16, wherein generating a feedback control signal as a function of a delayed source signal comprises coupling a third inverter and a fourth inverter in series with each other at an output of the programmable delay element.

18. The method of claim 15, wherein completing respective bypass circuits to effectively remove a corresponding reactive circuit element from a signal node in the variable delay generator comprises removing a capacitance from the signal node.

19. The method of claim 15, further comprising arranging the variable delay generator in a differential circuit configuration.

20. The method of claim 15, further comprising arranging native field-effect transistors as capacitors.

* * * * *